US008237291B2

(12) United States Patent
Kim

(10) Patent No.: US 8,237,291 B2
(45) Date of Patent: Aug. 7, 2012

(54) STACK PACKAGE

(75) Inventor: Seong Cheol Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 249 days.

(21) Appl. No.: 12/647,625

(22) Filed: Dec. 28, 2009

(65) Prior Publication Data

US 2010/0213596 A1 Aug. 26, 2010

(30) Foreign Application Priority Data

Feb. 25, 2009 (KR) ........................ 10-2009-0015999

(51) Int. Cl.
*H01L 23/48* (2006.01)
*H01L 23/52* (2006.01)

(52) U.S. Cl. . 257/777; 257/686; 257/784; 257/E23.169; 257/E23.175

(58) Field of Classification Search ............... 257/784, 257/777, 686, E23.022, E23.169, E23.175
See application file for complete search history.

(56) References Cited

U.S. PATENT DOCUMENTS

| | | | | |
|---|---|---|---|---|
| 5,793,108 A * | 8/1998 | Nakanishi et al. | ............ | 257/723 |
| 6,051,878 A * | 4/2000 | Akram et al. | ................ | 257/686 |
| 6,239,496 B1 * | 5/2001 | Asada | ............................ | 257/777 |
| 6,686,656 B1 * | 2/2004 | Koh et al. | ...................... | 257/686 |
| 6,847,105 B2 * | 1/2005 | Koopmans | ...................... | 257/686 |
| 6,933,598 B2 * | 8/2005 | Karnezos | ....................... | 257/686 |
| 7,132,753 B1 * | 11/2006 | St. Amand et al. | ............ | 257/777 |
| 2002/0195697 A1 * | 12/2002 | Mess et al. | ..................... | 257/686 |
| 2005/0029645 A1 * | 2/2005 | Mess et al. | ..................... | 257/686 |
| 2006/0197211 A1 * | 9/2006 | Miyata et al. | .................. | 257/686 |
| 2007/0102801 A1 | 5/2007 | Ishida et al. | | |
| 2008/0150158 A1 * | 6/2008 | Chin | ............................. | 257/777 |
| 2009/0032969 A1 * | 2/2009 | Pilla | ............................. | 257/777 |
| 2009/0309242 A1 * | 12/2009 | Mizuno et al. | ................ | 257/786 |

FOREIGN PATENT DOCUMENTS

| | | |
|---|---|---|
| KR | 1020010061886 A | 7/2001 |
| KR | 1020020028474 A | 4/2002 |

* cited by examiner

*Primary Examiner* — Nitin Parekh
(74) *Attorney, Agent, or Firm* — Ladas & Parry LLP

(57) ABSTRACT

A stack package includes a substrate having an upper surface and a lower surface which faces away from the upper surface, a lower stack group, an upper stack group, and connection members. The lower stack group is attached to the upper surface of the substrate and includes at least two semiconductor chips which are stacked in a face-up type to form on or more steps. The upper stack group is disposed over the lower stack group and includes at least two semiconductor chips which are stacked in a face-down type in such a way as to form one or more steps whose direction mirrors the direction of the at least one step of the lower stack group. The connection members electrically connect the semiconductor chips of the lower and upper stack groups to the substrate.

20 Claims, 2 Drawing Sheets

STACK PACKAGE

CROSS-REFERENCE TO RELATED APPLICATIONS

The present application claims priority to Korean patent application number 10-2009-0015999 filed on Feb. 25, 2009, which is incorporated herein by reference in its entirety.

BACKGROUND OF THE INVENTION

The present invention relates generally to a semiconductor device, and more particularly, to a stack package.

In the semiconductor industry, packaging technology for integrated circuits is continuously being developed to satisfy the demands of miniaturization and mounting reliability. For example, the demand for miniaturization has expedited the development of techniques for a package having a size approaching to that of a chip, and the demand for mounting reliability has highlighted the importance of packaging techniques for improving the efficiency of mounting work and mechanical and electrical reliability after mounting.

As miniaturization and high performance are demanded in electric and electronic products, new techniques for providing a semiconductor module of high capacity should be developed. One method for providing a semiconductor module of high capacity includes the high integration of a memory chip. The high integration of a memory chip can be accomplished by integrating an increased number of cells in the limited space of the semiconductor chip.

However, the high integration of a memory chip requires high precision techniques, such as a fine line width, and a lengthy development period. Under these situations, a stacking technique has been suggested as another method for providing a semiconductor module of high capacity.

The stacking techniques can generally be divided into methods of embedding two stacked chips in one package and methods of stacking two separate packages which are independently packaged. However, the method of stacking two separate packages cannot accommodate the trend toward miniaturization of electric and electronic products, since each of the separate packages contributes to an increased height and size.

Therefore, a stack package or a multi-chip package realized by embedding at least two semiconductor chips in one package has certain advantages over independently packaged chips.

When manufacturing a stack package, in the case of stacking semiconductor chips of a double bonding pad type, a vertical stacking procedure, in which semiconductor chips are stacked vertically, is mainly adopted. In the case of stacking semiconductor chips of a single bonding pad type, a step-like stacking procedure, in which semiconductor chips are stacked in such a way as to expose the bonding pads thereof, is mainly adopted.

In the conventional art, wires are used to electrically connect the respective stacked semiconductor chips to a substrate. In order to accommodate these wires, the transverse and longitudinal sizes of the finished package must be increased a relatively large degree, whereby difficulties exist in realizing a light, thin, compact and miniaturized structure of the package.

Also, the wire bonding length of upwardly positioned semiconductor chips increases as an increased number of semiconductor chips are stacked, and therefore substantial differences exist in the path lengths of electrical signals for a downwardly positioned semiconductor chip and an upwardly positioned semiconductor chip. Therefore, the electrical signals of the different semiconductor chips of a package are likely to be mismatched.

Moreover, when the stack package is manufactured through the step-like stacking procedure, in addition to the problems caused due to the presence of the wires, a problem is caused in that the transverse size of the package significantly increases as the number of stacked semiconductor chips increases.

BRIEF SUMMARY OF THE INVENTION

Embodiments of the present invention include a stack package having a configuration which can minimize the overall size of the stack package.

Also, embodiments of the present invention include a stack package which can prevent mismatch of electric signals.

In one embodiment of the present invention, a stack package comprises a substrate having an upper surface and a lower surface which faces away from the upper surface; a lower stack group attached to the upper surface of the substrate and having at least two semiconductor chips which are stacked in a face-up type to form one or more steps; an upper stack group disposed over the lower stack group and having at least two semiconductor chips which are stacked so as to form one or more steps whose direction mirrors that of the lower stack group; and connection members electrically connecting the semiconductor chips of the lower and upper stack groups with to substrate.

The lower stack group may comprise a first semiconductor chip having first bonding pads which are disposed adjacent to one is edge of the first semiconductor chip; and a second semiconductor chip stacked on the first semiconductor chip so as to from a step with the first semiconductor chips and such that the first bonding pads are exposed, and having second bonding pads which are disposed adjacent to one edge of the second semiconductor chip.

One or more second semiconductor chips may be stacked in the form of steps such that their second bonding pads are exposed.

The upper stack group may comprise a third semiconductor chip having third bonding pads which are disposed adjacent to one edge of the third semiconductor chip, and disposed on an uppermost semiconductor chip of the lower stack group to define the shape of mirror images together with the uppermost semiconductor chip; and a fourth semiconductor chip having fourth bonding pads which are disposed adjacent to one edge of the second semiconductor chip, and stacked on the third semiconductor chip in the form of steps to define the shape of mirror images together with a semiconductor chip of the lower stack group such that the fourth bonding pads are exposed.

One or more fourth semiconductor chips may be stacked in the form of steps such that their fourth bonding pads are exposed.

The stack package may further comprise a spacer interposed between the lower stack group and the upper stack group.

The connection members may comprise a plurality of first wiring films connected to the respective semiconductor chips of the lower and upper stack groups; and second wiring films connecting the first wiring films and the substrate.

The first and second wiring films may comprise any one of ACF (anisotropic conductive film), ACP (anisotropic conductive paste), and ACI (anisotropic conductive ink).

The connection members may comprise a plurality of wires which separately connect the respective semiconductor chips of the lower and upper stack groups and the substrate.

The connection members may comprise first wires having one ends which are separately connected to the respective semiconductor chips of the lower and upper stack groups and the other ends which are connected with each other or one another; and second wires connecting the other ends of the first wires which are connected with each other or one another and the substrate.

The connection members may comprise first wires connecting the semiconductor chips of the lower stack group and the semiconductor chips of the upper stack group which define the shape of mirror images such that the first wires do not cross with each other; and second wires connecting the first wires and the substrate.

The stack package may further comprise an encapsulant member sealing the upper surface of the substrate including the lower and upper stack groups and the connection members; and external connection terminals attached to the lower surface of the substrate.

DESCRIPTION OF SPECIFIC EMBODIMENT

Hereafter, specific embodiments of the present invention will be described in detail with reference to the accompanying drawings.

It is understood herein that the drawings are not necessarily to scale and in some instances proportions may have been exaggerated in order to more clearly depict certain features of the invention.

Figure 1:
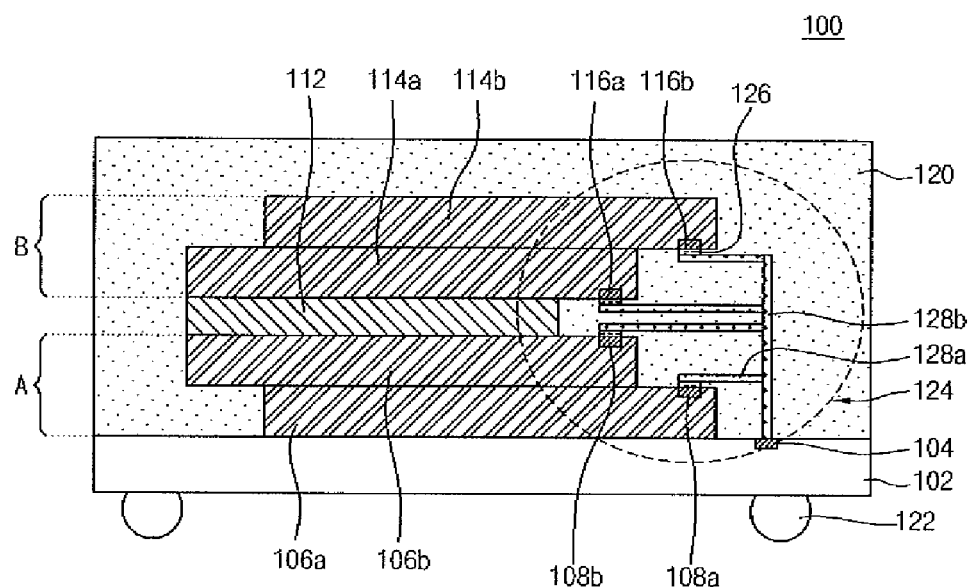
FIG. 1 is a cross-sectional view showing a stack package in accordance with an embodiment of the present invention.

FIG. 1 is a cross-sectional view showing a stack package in accordance with an embodiment of the present invention.

Referring to FIG. 1, a stack package 100 in accordance with an embodiment of the present invention includes a substrate 102, a lower stack group A which is attached onto the substrate 102, an upper stack group B which is disposed over the lower stack group A, and connection members 124 which electrically connect the lower and upper stack groups A and B to the substrate 102. Also, the stack package according to an embodiment includes an encapsulant member 120 which seals the upper surface of the substrate 102 including the stacked lower and upper stack groups A and B and the connection members 124, and external connection terminals 122 which are attached to the lower surface of the substrate 102.

The substrate 102 has the upper surface and a lower surface which faces away from the upper surface, and includes bond fingers 104 which are disposed on the upper surface.

The lower stack group A includes at least two stacked semiconductor chips 106a and 106b, for example, a first semiconductor chip 106a and a second semiconductor chip 106b. The semiconductor chips 106a and 106b of the lower stack group A have a plurality of first and second bonding pads 108a and 108b respectively. The first and second bonding pads 108a and 108b are disposed adjacent to one edge of the respective semiconductor chips 106a and 106b. The first and second semiconductor chips 106a and 106b are stacked in a face-up type in such a way as to form one or more step such that the bonding pads 108a and 108b are exposed. The lower stack group A is attached onto the substrate 102 in such a way as to expose the bond fingers 104 of the substrate 102.

Although not shown in detail, it is understood that the is lower stack group can include additional semiconductor chips stacked on the second semiconductor chip 106b in such a way as to form further steps such that their bonding pads are exposed.

The upper stack group B is disposed over the lower stack group A by, for example, the medium of a spacer 112. The spacer 112 can be understood as functioning to fasten the upper stack group B over the lower stack group A and secure a space for forming the connection members 124 which connect the respective semiconductor chips 106, 106b, 114a and 114b of the lower and upper stack groups A and B to the substrate 102. For example, the spacer 112 can contain an adhesive substance.

The upper stack group B has a structure in which at least two semiconductor chips 114a and 114b are stacked in such a way that the semiconductor chips 114a and 114b of the upper stack group B and the semiconductor chips 106a and 106b of the lower stack group A mirror each other relative to the line C shown in FIG. 1. Thus, as is shown in FIG. 1, the at least two semiconductor chips of the upper stack group B form one or more steps whose direction mirrors those steps of the lower stack group with respect to the line C; or in other words, when referring to FIG. 1, the horizontal distance from the bonding pads 116b and 116a to the bond fingers 104 increased when moving from the uppermost semiconductor chip to the lowermost semiconductor chip in the upper stack group, and the horizontal distance form the bonding pads 108b, 108a to the decreases when moving from the uppermost semiconductor chip to the lowermost semiconductor chip. Thus, the upper stack group B has a structure in which at least two semiconductor chips 114a and 114b having bonding pads 116a and 116b disposed adjacent to one edge thereof are stacked in a face-down type in the form of steps such that the bonding pads 116a and 116b are exposed. For example, in the embodiment shown in FIG. 1, the upper stack group B includes a third semiconductor chip 114a which has third bonding pads 116a disposed adjacent to one edge thereof and a fourth semiconductor chip 114b which has fourth bonding pads 116b disposed adjacent to one edge thereof both stacked in a face-down type so as to form a step. Accordingly, in an embodiment, the third semiconductor chip 114a of the upper stack group B is disposed to be symmetric to the second semiconductor chip 106b of the lower stack group A such that the second bonding pads 108b and the third bonding pads 116a face each other, and the fourth semiconductor chip 114b of the upper stack group B is disposed to be symmetric to the first semiconductor chip 106a of the lower stack group A such that the to first bonding pads 108a and the fourth bonding pads 116b face each other.

Hence, the bonding pads 108a and 108b of the respective semiconductor chips 106a and 106b of the lower stack group A are disposed to face the bonding pads 116b and 116a of the respective semiconductor chips 114b and 114a of the upper stack group B. Due to this fact, a specified space is defined between the lower stack group A and the upper stack group B which are disposed so that the direction of their respective steps mirror each other.

While not shown in detail, similar to the lower stack group A, it is understood that the upper stack group B can include additional semiconductor chips stacked on the fourth semiconductor chip 114b of the upper stack group B in such a way as to form further steps such that their bonding pads are exposed.

The connection members 124 are formed in the space defined between the lower stack group A and the upper stack group B which are disposed such that the direction of their respective steps mirror each other, in such a way as to electrically connect the respective semiconductor chips 106a, 106b, 114a and 114b of the lower and upper stack groups A and B to the substrate 102.

In the stack package according to the present invention, the connection members 124 can be formed in the ways described below.

First, as shown in FIG. 1, in an embodiment the connection members 124 can be formed to have a structure including a plurality of first wiring films 128a which are connected to the respective semiconductor chips 106a, 106b, 114a and 114b of the lower and upper stack groups A and B, and second wiring films 128b which connect the first wiring films 128a to the substrate 102. The first wiring films 128a have first ends which are connected to the bonding pads 108a, 108b, 116a and 116b of the respective semiconductor chips 106a, 106b, 114a and 114b of the lower and upper stack groups A and B, and second ends which are connected to first ends and the intermediate portions of the second wiring films 128b. The other second ends of the second wiring films 128b are connected to the bond fingers 104 of the substrate 102. Connection members 126, for example, such as solder, are formed between the first wiring films 128a and the respective semiconductor chips 106a, 106b, 114a and 114b so as to improve the reliability of electrical connections.

The first wiring films 128a and the second wiring films 128b can comprise, for example, any one of ACF (anisotropic conductive film), ACP (anisotropic conductive paste), and ACI (anisotropic conductive ink). Besides the ACF, ACP and ACI, the first and second wiring films 128a and 128b can comprise other members, including wiring lines, capable of electrically connecting the semiconductor chips 106a, 106b, 114a and 114b to the substrate 102.

Figure 2:
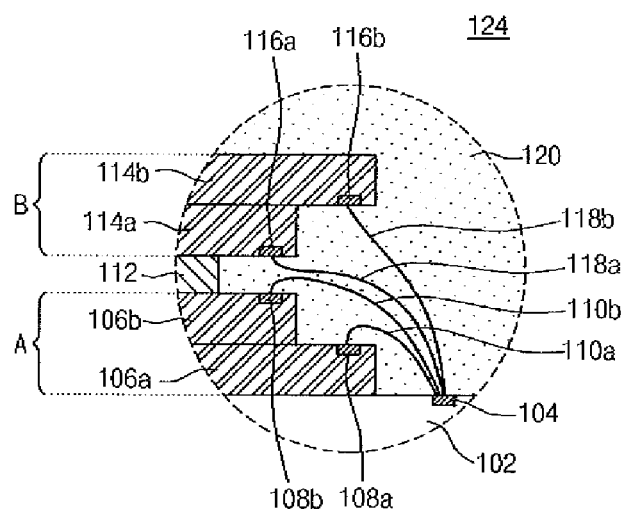
FIGS. 2 through 4 are cross-sectional views showing variations of connection members of a stack package in accordance with embodiments of the present invention.

Second, as shown in FIG. 2, in an embodiment the connection members 124 can include a plurality of wires 110a, 110b, 118a and 118b which separately connect the respective semiconductor chips 106a, 106b, 114a and 114b of the lower and upper stack groups A and B to the substrate 102.

Figure 3:
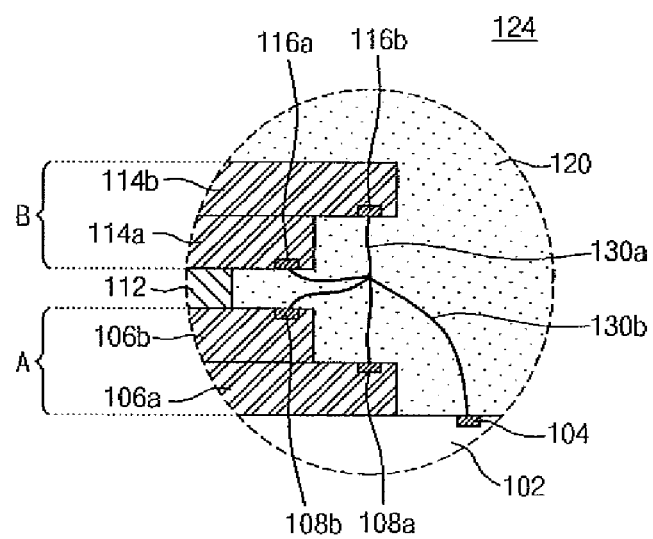

Third, as shown in FIG. 3, in an embodiment the connection members 124 can be formed to have a structure including first wires 130a which are connected to the respective semiconductor chips 106a, 106b, 114a and 114b of the lower and upper stack groups A and B, and second wires 130b which connect the first wires 130a to the substrate 102. The first wires 130a have first ends which are connected to the bonding pads 108a, 108b, 116a and 116b of the respective semiconductor chips 106a, 106b, 114a and 114b of the lower and upper stack groups A and B and second ends which are connected to first ends of the second wires 130b. The second ends of the second wires 130b are connected to the bond fingers 104 of the substrate 102.

The connection members 124 including the first wires 130a and the second wires 130b can be formed, for example, as in the following methods.

In a first method, in a state in which the lower stack group A and the upper stack group B are disposed on the substrate 102 to be separated from each other, the semiconductor chips 106a and 106b of the lower stack group A and the semiconductor chips 114a and 114b of the upper stack group B are connected to each other by the first wires 130a in a manner such that the first wires 130a cross (or connect) with each other, and then, the second wires 130b are formed in such a way as to connect the crossing points (or connection points) of the first wires 130a to the bond fingers 104 of the substrate 102. Thereupon, the upper stack group B having the first and second wires 130a and 130b connected to each other is attached to the lower stack group A by the medium of the spacer 112.

In a second method, in a state in which the lower stack group A and the upper stack group B are disposed on the substrate 102 to be separated from each other, the first wires 130a are formed such that first ends of the first wires 130a are connected to the bonding pads 108a and 108b of the respective semiconductor chips 106a and 106b of the lower stack group A, first ends of the first wires 130a are connected to the bonding pads 116a and 116b of the respective semiconductor chips 114a and 114b of the upper stack group B, the second ends of the first wires 130a connected to the bonding pads 108a and 108b are connected to each other, and the second ends of the first wires 130a connected to the bonding pads 116a and 116b are connected to each other. Then, the second wires 130b are formed in such a way as to connect the first wires 130a connected to the lower stack group A to the bond fingers 104 of the substrate 102. Thereupon, the upper stack group B is attached to the lower stack group A by the medium of the spacer 112, and the connection points of the first wires 130a which are connected to the lower stack group A and the upper stack group B are connected to each other.

When forming the connection members 124 to have the above-described structures, it is preferred that the lower stack group A be completely attached to the substrate 102 before forming the first and second wires 130a and 130b, and the upper stack group B be incompletely attached with respect to the substrate 102. Also, it is preferred that the connection points of the first wires 130a be placed in the space defined due to attachment of the lower stack group A to the upper stack group B.

The connection members 124 including the first wires 130a and the second wires 130b can be used to connect semiconductor chips which have the same kind of signals. In the case where different kinds of signals are required in semiconductor chips, additional connections can be formed in conformity with required signals.

Figure 4:
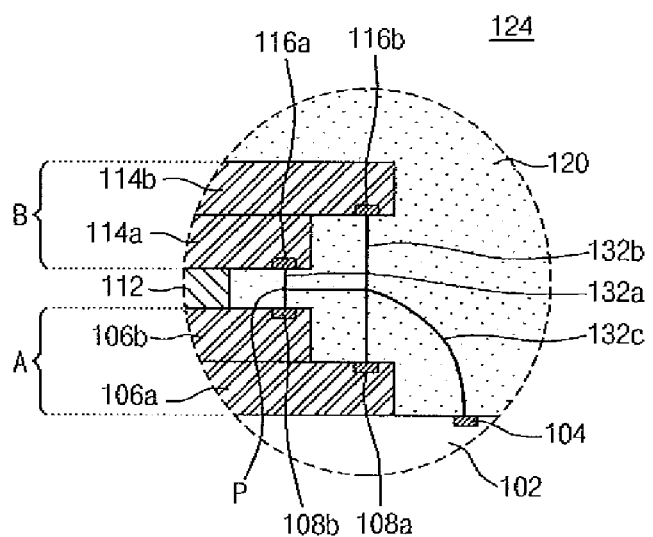

Fourth, as shown in FIG. 4, in an embodiment the connection members 124 can be formed to have a structure including first wires 132a and second wires 132b which connect the semiconductor chips 106a and 106b of the lower stack group A and the semiconductor chips 114a and 114b of the upper stack group B respectively, and, for example, disposed so as to mirror themselves relative to the line C (FIG. 1), and third wires 132c which connect the first and second wires 132a and 132b with the bond fingers 104 of the substrate 102.

The connection members 124 structured in this way can be realized, for example, as described below. In a state in which the lower stack group A and the upper stack group B are disposed on the substrate 102 to be separated from each other, the first wires 132a are formed to connect the first semiconductor chip 106a of the lower stack group A to the fourth semiconductor chip 114b of the upper stack group B, and the second wires 132b are formed to connect the second semiconductor chip 106b of the lower stack group A to the third semiconductor chip 114a of the upper stack group B, such that the first wires 132a and the second wires 132b do not cross with each other. Then, the third wires 132c are formed to be connected to both the first and second wires 132a and 132b and the bond fingers 104 of the substrate 102, and thereupon, the upper stack group B formed with the first and second wires 132a and 132b is attached to the lower stack group A by the medium of the spacer 112.

As mentioned above, in the connection members 124 structured in this way, it is preferred that the lower stack group A be completely attached to the substrate 102 before forming the first through third wires 132a, 132b and 132c and the upper stack group B be incompletely attached with respect to the substrate 102. Also, it is preferred that the connection points of the first through third wires 132a, 132b and 132c be placed in the space defined due to attachment of the lower stack group A and the upper stack group B.

The connection members 124 including the first through third wires 132a, 132b and 132c can be used to connect semiconductor chips which have the same kind of signals. In the case where different kinds of signals are required in semiconductor chips, additional connections can be formed in conformity with required signals.

The encapsulant member 120 is formed to protect the lower and upper stack groups A and B from external stresses. The encapsulant member 120 is formed to seal the upper surface of the substrate 102 including the lower and upper stack groups A and B and the connection members 124. The encapsulant member 120 can comprise, for example, an EMC (epoxy molding compound).

The external connection terminals 122 are attached to ball lands which are disposed on the lower surface of the substrate 102, as mounting means to external circuits. The external connection terminals 122 can comprise, for example, solder balls.

As is apparent from the above description, in the present invention, due to the fact that semiconductor chip groups, each of which includes semiconductor chips stacked so as to form one or more steps, are disposed so as to form mirror images (or at least the direction of steps mirroring each other), it is possible to realize a stack package which does not substantially increased the overall size thereof while stacking semiconductor chips so as to form steps. Accordingly, in the present invention, by stacking a number of semiconductor chips, it is possible to realize a stack package which has high capacity and a light, thin, compact and miniaturized structure.

Also, in the present invention, since connection members are formed in the space defined between the semiconductor chip groups resulting from their respective steps mirroring each other, the lengths of electric signals between the semiconductor chips and a substrate can be made substantially similar, and accordingly, it is possible to prevent electric signals from being mismatched.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A stack package comprising:
    a substrate having an upper surface and a lower surface which faces away from the upper surface;
    a lower stack group attached to the upper surface of the substrate and including at least two semiconductor chips which are stacked in a face-up type in such a way as to form at least one step;
    an upper stack group disposed over the lower stack group and including at least two semiconductor chips which are stacked in a face-down type in such a way as to form at least one step whose direction mirrors the direction of the at least one step of the lower stack group; and
    connection members electrically connecting the semiconductor chips of the lower and upper stack groups to the substrate.

2. The stack package according to claim 1, wherein the lower stack group comprises:
    a first semiconductor chip having at least one first bonding pad which is disposed adjacent to one edge of the first semiconductor chip; and
    a second semiconductor chip stacked on the first semiconductor chip so as to form a step with the first semiconductor chip and such that the at least one first bonding pad is exposed, the second semiconductor chip having at least one second bonding pad which is disposed adjacent to one edge of the second semiconductor chip.

3. The stack package according to claim 2, wherein a plurality of the second semiconductor chips are stacked so as to form steps such that their second bonding pads are exposed.

4. The stack package according to claim 1, wherein the upper stack group comprises:
    a third semiconductor chip having at least one third bonding pad which is disposed adjacent to one edge of the third semiconductor chip, and disposed on an uppermost semiconductor chip of the lower stack group to define the shape of mirror images together with the uppermost semiconductor chip; and
    a fourth semiconductor chip having at least one fourth bonding pad which is disposed adjacent to one edge of the second semiconductor chip, and stacked on the third semiconductor chip so as to form a step with the third semiconductor chip and to define the shape of mirror images together with a semiconductor chip of the lower stack group such that the fourth bonding pad is exposed.

5. The stack package according to claim 4, wherein a plurality of the fourth semiconductor chips are stacked so as to form steps such that their fourth bonding pads are exposed.

6. The stack package according to claim 1, further comprising:
    a spacer interposed between the lower stack group and the upper stack group.

7. The stack package according to claim 1, wherein the connection members comprise:
    a plurality of first wiring films connected to the respective semiconductor chips of the lower and upper stack groups; and
    at least one second wiring film connecting the first wiring films to the substrate.

8. The stack package according to claim 7, wherein the first and second wiring films comprise any one of ACF (anisotropic conductive film), ACP (anisotropic conductive paste), and ACI (anisotropic conductive ink).

9. The stack package according to claim 1, wherein the connection members comprise:
    a plurality of wires which separately connect the respective semiconductor chips of the lower and upper stack groups to the substrate.

10. The stack package according to claim 1, wherein the connection members comprise:
    first wires having first ends which are separately connected to the respective semiconductor chips of the lower and upper stack groups and second ends which are connected to each other or one another; and
    at least one second wire connecting the second ends of the first wires to the substrate.

11. The stack package according to claim 1, wherein the connection members comprise:
    first wires connecting the semiconductor chips of the lower stack group to the semiconductor chips of the upper stack group in a manner such that the first wires do not cross with each other; and
    at least one second wire connecting the first wires to the substrate.

12. The stack package according to claim 1, further comprising:
- an encapsulant member sealing the upper surface of the substrate including the lower and upper stack groups and the connection members; and
- external connection terminals attached to the lower surface of the substrate.

13. A stack package comprising:
- a substrate having an upper surface and a lower surface which faces away from the upper surface;
- a lower stack group attached to the upper surface of the substrate and including at least a first semiconductor chip and a second semiconductor chip which are stacked in a face-up type, the first and second semiconductor chips being offset so as to form a step in which a portion of the first semiconductor chip is not overlapped by the second semiconductor chip;
- an upper stack group disposed over the lower stack group and including at least a third semiconductor chip and a fourth semiconductor chip which are stacked in a face-down type, the third and fourth semiconductor chips being offset so as to form a step whose direction mirrors the direction of the step of the lower stack group; and
- connection members electrically connecting the semiconductor chips of the lower and upper stack groups to the substrate.

14. The stack package according to claim 13, wherein:
the first semiconductor chip includes at least one first bonding pad which is disposed adjacent to one edge of the first semiconductor chip; and
the second semiconductor chip is stacked on the first semiconductor chip such that is does not overlap the at least one first bonding pad, and the second semiconductor chip includes at least one second bonding pad which is disposed adjacent to one edge of the second semiconductor chip.

15. The stack package according to claim 13, wherein:
the third semiconductor chip includes at least one third bonding pad which is disposed adjacent to one edge of the third semiconductor chip, and is disposed on an uppermost semiconductor chip of the lower stack group to define the shape of mirror images together with the uppermost semiconductor chip; and
the fourth semiconductor chip includes at least one fourth bonding pad which is disposed adjacent to one edge of the second semiconductor chip, and is stacked on the third semiconductor chip so as to form a step with the third semiconductor chip and to define the shape of mirror images together with a semiconductor chip of the lower stack group such that the fourth bonding pad is exposed.

16. The stack package according to claim 13, further comprising:
a spacer interposed between the lower stack group and the upper stack group.

17. The stack package according to claim 13, wherein the connection members comprise:
- a plurality of first wiring films connected to the respective semiconductor chips of the lower and upper stack groups; and
- at least one second wiring film connecting the first wiring films to the substrate.

18. The stack package according to claim 17, wherein the first and second wiring films comprise any one of ACF (anisotropic conductive film), ACP (anisotropic conductive paste), and ACI (anisotropic conductive ink).

19. The stack package according to claim 13, wherein the connection members comprise:
a plurality of wires which separately connect the respective semiconductor chips of the lower and upper stack groups to the substrate.

20. The stack package according to claim 13, wherein the connection members comprise:
- first wires having first ends which are separately connected to the respective semiconductor chips of the lower and upper stack groups and second ends which are connected to each other or one another; and
- at least one second wire connecting the second ends of the first wires to the substrate.

* * * * *